(12) United States Patent
Jeon et al.

(10) Patent No.: US 7,976,226 B2
(45) Date of Patent: Jul. 12, 2011

(54) OPTICAL SUB-ASSEMBLY WITH ELECTRICALLY CONDUCTIVE PAINT, POLYMER OR ADHESIVE TO REDUCE EMI OR SENSITIVITY TO EMP OR ESD

(75) Inventors: Yong M Jeon, Berkely, CA (US); Vivien Tan Hui Ming, Singapore (SG)

(73) Assignee: Avago Technologies Fiber IP (Singapore) Pte. Ltd, Singapore (SG)

( * ) Notice: Subject to any disclaimer, the term of this patent is extended or adjusted under 35 U.S.C. 154(b) by 1025 days.

(21) Appl. No.: 11/770,347

(22) Filed: Jun. 28, 2007

(65) Prior Publication Data
US 2009/0003826 A1      Jan. 1, 2009

(51) Int. Cl.
*G02B 6/36* (2006.01)
(52) U.S. Cl. ......................................... 385/88
(58) Field of Classification Search .......................... None
See application file for complete search history.

(56) References Cited

U.S. PATENT DOCUMENTS

| | | | |
|---|---|---|---|
| 5,777,856 A | 7/1998 | Phillips et al. |
| 6,158,899 A | 12/2000 | Arp et al. |
| 6,201,908 B1 | 3/2001 | Grann |
| 6,206,582 B1 | 3/2001 | Gilliland |
| 6,396,978 B1 | 5/2002 | Grann |
| 6,456,757 B2 | 9/2002 | Kim et al. |
| 6,529,306 B1 | 3/2003 | Engel et al. |
| 6,558,046 B2 | 5/2003 | Griffis et al. |
| 6,563,976 B1 | 5/2003 | Grann et al. |
| 6,572,278 B2 | 6/2003 | Hsieh et al. |
| 6,607,308 B2 | 8/2003 | Dair et al. |
| 6,780,053 B1 | 8/2004 | Yunker et al. |
| 6,781,693 B2 | 8/2004 | Richard et al. |
| 6,816,646 B2 | 11/2004 | Nakama et al. |
| 6,854,894 B1 | 2/2005 | Yunker et al. |
| 6,856,722 B2 | 2/2005 | Sasaki et al. |
| 6,866,544 B1 | 3/2005 | Casey et al. |
| 6,877,913 B2 * | 4/2005 | Goto ............................... 385/88 |
| 7,044,791 B2 | 5/2006 | Wang |
| 7,135,643 B2 | 11/2006 | van Haaster et al. |
| 7,150,653 B1 | 12/2006 | Mason |
| 7,184,621 B1 | 2/2007 | Zhu |
| 2002/0018625 A1 | 2/2002 | Grann et al. |

(Continued)

FOREIGN PATENT DOCUMENTS

GB        2405951        3/2005

(Continued)

OTHER PUBLICATIONS

10GBASE-LX4 Pushes Multimode Fiber Limits. Bar-Nov et al., Apr. 14, 2005.

(Continued)

*Primary Examiner* — Charlie Peng
*Assistant Examiner* — Mary A El-Shammaa

(57) ABSTRACT

Disclosed are various embodiments of an optical wavelength division demultiplexer or multiplexer sub-assembly configured to receive or transmit optical signals conveyed thereto or therefrom by a fiber optic cable. Selected portions of external surfaces of the sub-assembly are coated with an electrically conductive paint, polymer or adhesive to provide an EMI, EMP or ESD shield. Typically, the sub-assembly comprises an integrally molded plastic optical block and a separate integrally molded coupling module with a ferrule and fiber optic cable receptacle. In one embodiment, selected external surfaces of the optical block and coupling module are coated with a coating having a predetermined electrical conductivity to provide a desired degree of EMI, EMP or ESD shielding.

21 Claims, 4 Drawing Sheets

U.S. PATENT DOCUMENTS

2003/0174454 A1* 9/2003 Fu et al. .................. 361/103

FOREIGN PATENT DOCUMENTS

WO     WO-02/079841     10/2002

OTHER PUBLICATIONS

ROSA: P1RX-LX4, Date Unknown.

New, Copact, LX4 ROSA with Integrated TIA and Limiting Amp Reduces Overall Power Consumption and Board Space, Omron Electronic Components, Mar. 2006.

10GBASE-X4 ROSA 4 Channel Demux with Integrated Detector Array. Cube Optics AG, Date Unknown.

Development of 10GBASE-LX4 Fiber-Optic Transceivers, Mauro et al., Hitachi Cable Review No. 25, Aug. 2006.

* cited by examiner

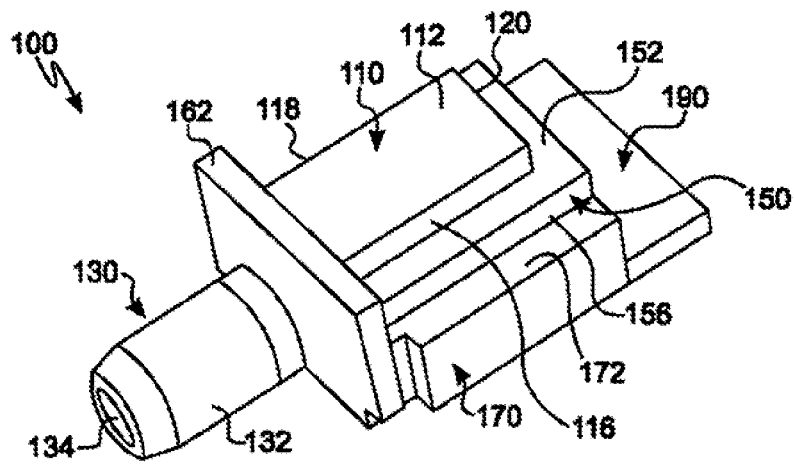
FIG. 4(a)
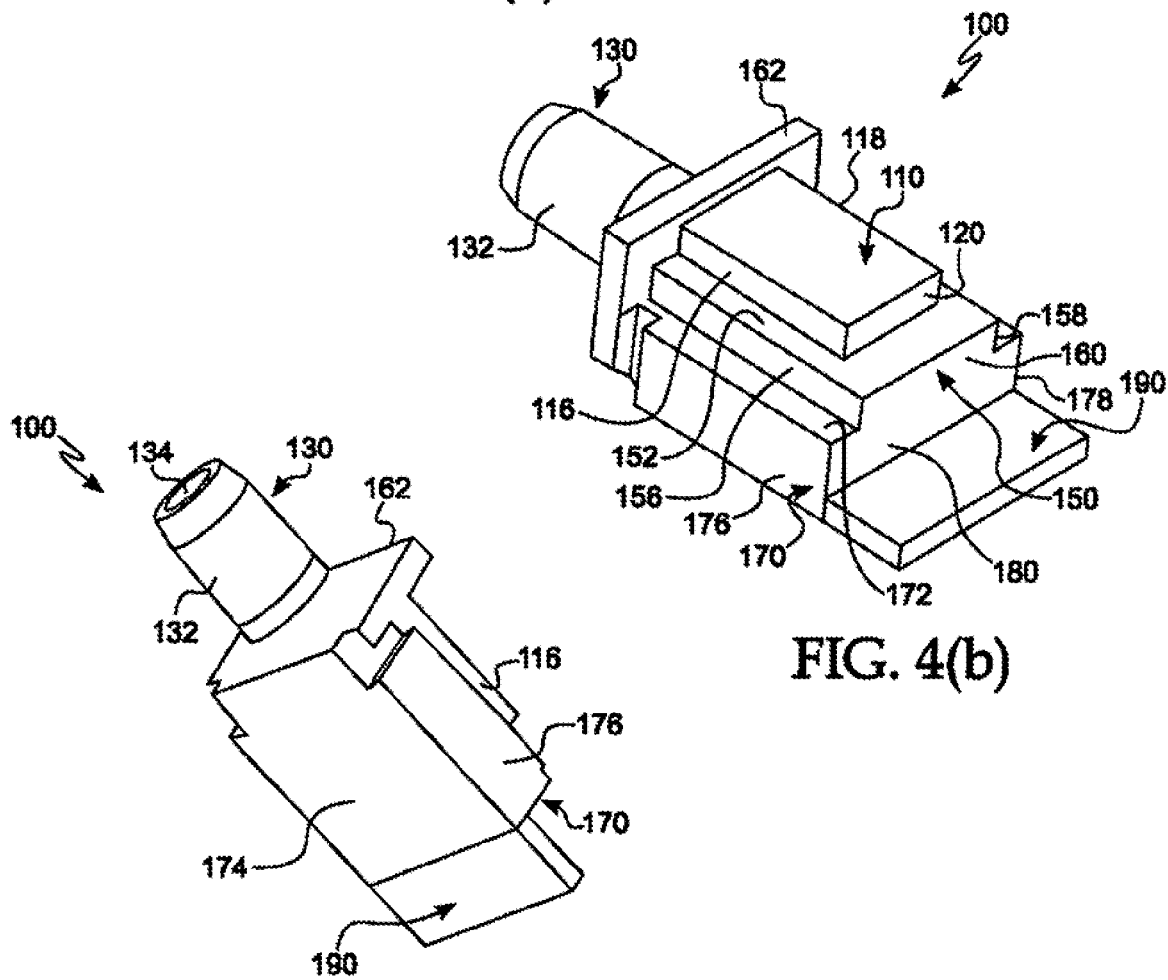
FIG. 4(b)
FIG. 4(c)

US 7,976,226 B2

OPTICAL SUB-ASSEMBLY WITH ELECTRICALLY CONDUCTIVE PAINT, POLYMER OR ADHESIVE TO REDUCE EMI OR SENSITIVITY TO EMP OR ESD

FIELD OF THE INVENTION

The present invention relates to the field of optical multiplexing and demultiplexing sub-assemblies for use in receiving and transmitting optical signals via fiber optic cables.

BACKGROUND

The use of optical multiplexing and demultiplexing sub-assemblies, and optical modules containing such sub-assemblies, in fiber optic communication systems is well known. Such sub-assemblies and optical modules are generally configured to receive and/transmit optical signals from or to fiber optic cables.

One example of an industry-standard form factor optical module containing such sub-assemblies is the now largely outdated XENPAK module. Due to the need to make optical modules ever smaller, the X2 optical module was recently introduced. The X2 module is configured to house a small form factor LX4 optical sub-assembly that typically supports optical communications at speeds of around 10 Gigabits per second.

The LX4 sub-assembly typically offers a single interface that can transmit or receive over both multimode and single mode optical fibers. The X2 form factor of the LX4 permits modular interconnections to be established, where the X2 module within which the LX4 module is housed is inserted, for example, into a pluggable port slot in a switch, router, server or storage system. The LX4 sub-assembly leverages the technology of wavelength division multiplexing ("WDM"), and permits transmission and reception of multiple signal sources, each at a different wavelength, over the same fiber optic cable.

FIG. 1 shows a block diagram of an exemplary 10 Gigabit LX4 transmitter and receiver system. As shown, a parallel interface known as "XAUI" is employed, as is typical in many 10 Gigabit per second chip-to-chip interfaces. XAUI is built over the physical coding layer ("PCS") into an XAUI physical layer ("PHY") that divides the 10 Gigabit per second stream of data into four parallel streams of 2.5 Gigabits per second each which, after 8B/10B coding, are converted into four data streams of 3.125 Gigabits per second each.

In transmitter 100a, four channels are fed into tour lasers, such as distributed feedback ("DFB") lasers. Each of the four lasers transmits signals at a different wavelength, which typically correspond to 1275 nm, ±6 nm; 1300 nm, ±6 nm; 1325 nm, ±6 nm; and 1350 nm, ±6 nm. These signals are multiplexed together using an optical multiplexer sub-assembly using a technique known as coarse wavelength division multiplexing ("CWDM") on a single optical fiber.

Receiver 100b comprises a CDWM demultiplexer and four PIN detectors, one for each of the four signals transmitted at a different wavelength. The current generated by each PIN is fed into a transimpedance amplifier ("TIA"), which generates four parallel electrical data streams operating at 3.125 Gigabits per second. The high attenuation associated with the fiber and the optical components typically results in low amplitude output signals being generated by the TIA, and as a result a limiting amplifier ("LA") follows the output of the TIA.

The four output streams from the LA are fed into an XAUI physical layer ("PHY") that recovers the clock from the data stream, and aligns the data to compensate for skew introduced between the four data streams arising from the different speeds of each wavelength in the fiber, and encodes them back to 8 bits in the 8B/10B PCS.

FIG. 2 shows a functional block diagram of one type of a 4 channel 10 GBASE-LX4 ROSA Receive Optical Sub-Assembly ("ROSA") demultiplexer with an integrated photodetector array, as manufactured by Cube Optics AG. Optical demultiplexer 100 comprises a four-channel optical receiver with a high speed PIN photodetector array and four transimpedance amplifiers with limiting function. The LX4 demultiplexer/receiver is designed for use in small form factor X2 transceiver modules with an optical connector receptacle, and has four 100 ohm differential CML RF output signals. In addition, an average optical power monitor signal allows active fiber alignment and a signal modulation detecting function enables loss of signal ("LOS") for each channel. The receiver requires a 3.3 V single power supply voltage ($V_{cc}$).

FIG. 3 shows an exemplary embodiment of X2 form factor optical module 200 that contains an LX4 optical sub-assembly. X2 form factor housing 200 is generally formed of a metal such as a zinc or aluminum alloy, and is typically die-cast. Being electrically conductive and surrounding LX4 sub-assembly 100, X2 form factor housing 200 provides some degree of electromagnetic interference ("EMI") protection or shielding.

Blaze Network Products, Inc. of Dublin, Calif. (hereafter "Blaze"), now owned by Omron Electronic Components, L.L.C. (hereafter "Omron"), manufactures several types of LX4 ROSAs and TOSAs ("Transmitter Optical Sub-Assemblies") finding particularly efficacious use in the various embodiments of the present invention, more about which we say below. By way of example, Omron manufactures and sells P1 RX-LX4 ROSAs and P1TX-LX4 TOSAs that may be adapted in accordance with the teachings of the present invention.

Blaze obtained several patents covering various aspects of a ROSA and/or a TOSA comprising various optical components configured to fit together and provide an optical sub-assembly capable of demultiplexing incoming or multiplexing outgoing optical signals of different wavelengths. See, for example, U.S. Pat. Nos. 6,201,908; 6,396,978; 6,456,757; 6,558,046; 6,563,976; and 6,572,278, further details concerning which are set forth below. The foregoing patents are hereby incorporated by reference herein, each in its respective entirety.

ROSAs and TOSAs manufactured by Omron are notable for having one or more important components thereof being constructed from integrally molded components formed of substantially optically transparent or transmissive plastic. Reference is now made to FIGS. 1 and 2 of U.S. Pat. No. 6,201,908, where incoming optical signals 90 are routed first through coupling module 60 (numeral 150 in FIGS. 4(a) through 4(c) hereof) by way of fiber optic cable receptacle 80 (numeral 134 in FIGS. 4(a) through 4(c) hereof) formed in ferrule 83 (numeral 130 in FIGS. 4(a) through 4(c) hereof) and configured to receive a fiber optic connector in therein.

From fiber optic cable receptacle 80 (numeral 134 in FIGS. 4(a) through 4(c) hereof), incoming optical signals 90 are directed through plastic collimating lens 65 in coupling module 60 (numeral 150 in FIGS. 4(a) through 4(c) hereof), and reflected upwardly by reflecting surface 66 towards optical block 20 (numeral 110 in FIGS. 4(a) through 4(c) hereof), which is most preferably formed of optical-grade glass provided by Schott AG of Germany. Reflecting surface 66 is most preferably a Total Internal Reflection ("TIR") surface or air prism. Reflective coating 85 is disposed on first flat upper surface 21 (numeral 112 in FIGS. 4(a) through 4(c) hereof), and is configured to reflect light incident thereon towards first wavelength filter 41.

Optical signals contained within optical signal 90 having the proper wavelength are permitted to pass through filter 41 for focusing by corresponding aspheric lens 71, and thence detection by an underlying corresponding photodetector. The remaining optical signals are reflected upwardly from filter 41 towards reflective coating 85 and first flat upper surface 21 (numeral 112 in FIGS. 4(a) through 4(c) hereof) for reflection therefrom towards filter 42 and corresponding aspheric lens 72. Light signals having wavelengths corresponding to the pass-band of filter 42 are permitted passage therethrough, while the remaining optical signals are once again directed towards reflective coating 85 and first flat upper surface 21 (numeral 112 in FIGS. 4(a) through 4(c) hereof).

The reflection and selective transmission and filtering of optical signal 90 continues until all the various wavelength components of optical signal 90 have been separated from one another according to wavelength, and have been transmitted through their respective aspheric lenses for detection by an array of photodetectors located beneath coupling module 60 (numeral 130 in FIGS. 4(a) through 4(c) hereof) in a photodetector array assembly (numeral 170 in FIGS. 4(a) through 4(c) hereof).

A substantially optically transparent or transmissive plastic may be employed to form coupling module 60 (numeral 130 in FIGS. 4(a) through 4(c) hereof) using integral molding techniques, and has many advantages, including permitting complex optical components such as precision aspheric lenses and TIR reflecting surfaces such as air prisms to be manufactured at relatively low cost.

There are several disadvantages to such an approach, however. One notable problem that has been discovered in the use of an integrally molded plastic coupling module 60 (numeral 130 in FIGS. 4(a) through 4(c) hereof) is that a not insignificant amount of undesirable EMI is generated inside such a module 60 (numeral 130 in FIGS. 4(a) through 4(c) hereof, and cannot be remedied merely by providing an X2 housing 200 formed of metal. Moreover, because component 60 (numeral 130 in FIGS. 4(a) through 4(c) hereof) is formed of plastic, providing cost-effective EMI shielding of such a component presents particular challenges. For example, sputtering, vapor-depositing or electro-plating such plastic components is difficult, time-consuming and expensive. Shielding such plastic components with overlying physical components such as wire shielding is also expensive, and additionally consumes excessive volume within the already small interior volume of X2 housing 200.

What is needed is a means of providing EMI shielding for substantially optically transparent or transmissive components, be they glass or plastic) in LX4 ROSAs and TOSAs, as well as in similar or like devices, that is functionally effective, amenable for use with plastic or glass, and that requires the use of minimal additional volume inside an X2 or other housing.

Various patents containing subject matter relating directly or indirectly to the field of the present invention include, but are not limited to, the following.

U.S. Pat. No. 5,777,856 to Phillips et al. for "Integrated Shielding and Mechanical Support," Jul. 7, 1998.

U.S. Pat. No. 6,201,908 to Grann for "Optical Wavelength Division Multiplexer/Demultiplexer Having Preformed Passively Aligned Optics," Mar. 13, 2001.

U.S. Pat. No. 6,206,582 to Gilliland for "EMI Reduction for Optical Subassembly," Mar. 27, 2001.

U.S. Pat. No. 6,396,978 to Grann for "Optical Wavelength Division Multiplexer/Demultiplexer Having Patterned Opaque Regions to Reduce Optical Noise," May 28, 2002.

U.S. Pat. No. 6,456,757 to Kim et al. for "Optical Wavelength Division Multiplexer/Demultiplexer Having Adhesive Overflow Channels with Dams to Achieve Tight Adhesive Bond," Sep. 24, 2002.

U.S. Pat. No. 6,529,306 to Engel et al., for "Electromagnetic Interference Reduction Method and Apparatus," Mar. 4, 2003.

U.S. Pat. No. 6,558,046 to Griffis et al. for "Optical Wavelength Division Multiplexer/Demultiplexer with Mechanical Strain Relief" May 6, 2003.

U.S. Pat. No. 6,563,976 to Grann et al. for "Cost-Effective Wavelength Division Multiplexer and Demultiplexer," May 13, 2003.

U.S. Pat. No. 6,572,278 to Hsieh et al. for "Opto-Electronic Device Having Staked Connection between Parts to Prevent Differential Thermal Expansion," Jun. 3, 2003.

U.S. Pat. No. 6,607,308 to Dair et al. for "Fiber-Optic Modules with Shielded Housing/Covers Having Mixed Finger Types," Aug. 19, 2003.

U.S. Pat. No. 6,780,053 to Yunker et al. for "Pluggable Small-Form Factor Transceivers," Aug. 24, 2004.

U.S. Pat. No. 6,781,693 to Richard et al. for "System and Method for Optical Multiplexing and/or Demultiplexing," Aug. 24, 2004.

U.S. Pat. No. 6,816,646 to Nakama et al. for "Light-Sensitive Detector and Optical Demultiplexer," Nov. 9, 2004.

U.S. Pat. No. 6,866,544 to Casey et al., for "Methods and Apparatus for Mounting an Electromagnetic Interference Shielding Cage to a Circuit Board," Mar. 15, 2005.

U.S. Pat. No. 6,854,894 to Yunker et al. for "Optical Receptacle, Transceiver and Cage," Feb. 15, 2005.

U.S. Pat. No. 6,856,722 to Sasaki et al. for "Optical Demultiplexer and Optical Multiplexer for wavelength Division Multiplex Communication," Feb. 15, 2005.

U.S. Pat. No. 7,044,791 to Wang for "Shielded Optical-Electric Connector," May 16, 2006.

U.S. Pat. No. 7,135,643 to van Haaster et al. for "EMI Shield Including a Lossy Medium," Nov. 14, 2006.

U.S. Pat. No. 7,150,653 to Mason for "Techniques for EMI Shielding of a Transceiver Module," Dec. 19, 2006.

U.S. Pat. No. 7,184,621 to Zhu for "Multi-Wavelength Transmitter Optical Sub Assembly with Integrated Multiplexer," Feb. 27, 2007.

The dates of the foregoing publications may correspond to any one of priority dates, filing dates, publication dates and issue dates. Listing of the above patents and patent applications in this background section is not, and shall not be construed as, an admission by the applicants or their counsel that one or more publications from the above list constitutes prior art in respect of the applicant's various inventions.

Upon having read and understood the Summary, Detailed Description and Claims set forth below, those skilled in the art will appreciate that at least some of the systems, devices, components and methods disclosed in the printed publications listed herein may be modified advantageously in accordance with at least some of the teachings of the various embodiments of the present invention.

SUMMARY

According to one embodiment, there is provided an optical wavelength division or combination sub-assembly configured to receive or transmit optical signals conveyed thereto or therefrom which comprises an optically transparent or transmissive optical block comprising a substantially flat first upper external surface and an opposing substantially flat first lower external surface, two opposing first side external surfaces, and at least one first end external surface, a ferrule comprising an outer surface and a fiber optic cable receptacle for receiving the end of a fiber optic cable, a coupling module coupled to the ferrule and comprising a substantially flat second upper external surface and an opposing second lower external surface, two opposing second side external surfaces, at least one second end external surface, a strain relief flange configured to transfer loads applied to the ferrule and receptacle, and an electrically conductive paint, polymer or adhesive covering at least portions of one of the external surfaces.

The electrically conductive paint, polymer or adhesive may be configured or formulated to provide one or more of electromagnetic interference ("EMI"), electromagnetic pulse ("EMP"), or electrostatic discharge ("ESD") shielding in respect of the sub-assembly. The degree of electrical conductivity of the resulting coating determines whether the resulting shield operates as an EMI, EMP or ESD shield in respect of the sub-assembly.

The one or more external surfaces coated with the electrically conductive paint, polymer or adhesive may comprise any one or more of an external surface selected from the group consisting of the first upper external surface, the two opposing first side external surfaces, the external surface of the ferrule, and the two opposing second side external surfaces. Selected external surfaces of a photodetector array housing attached to the bottom of the coupling module may also be so coated.

If an electrically conductive paint is employed to form the electrically conductive coating, the paint is loaded with at least one of electrically conductive particles, electrically conductive carbon fibers, flakes and particles, carbon black, graphite, nano-particles, metal beads, flakes or particles, and metal, glass or ceramic beads, flakes or particles that have been coated with a suitable metal such as silver, copper, nickel, tin, zinc or aluminum.

If an electrically conductive polymer, elastomer, elastomeric compound, silicone, urethane, polyurethane, polysulfide or latex is employed to form the electrically conductive coating, such a composition or compound is loaded with at least one of electrically conductive particles, electrically conductive carbon fibers, flakes and particles, carbon black, graphite, nano-particles, metal flakes, beads or particles, and metal, glass or ceramic beads, flakes or particles that have been coated with a suitable metal such as silver, copper, nickel, tin, zinc or aluminum.

If an electrically conductive adhesive is employed to form the electrically conductive coating, the adhesive is loaded with at least one of electrically conductive particles, electrically conductive carbon fibers, flakes and particles, carbon black, graphite, nano-particles, metal flakes, beads or particles, and metal, glass or ceramic beads, flakes or particles that have been coated with a suitable metal such as silver, copper, nickel, tin, zinc or aluminum.

In one embodiment, a combination of two or more electrically conductive paints, polymers or adhesives is employed to form the electrically conductive coating.

The electrically conductive coating may also comprise an electrically conductive ink or gel.

In a preferred embodiment, the electrically conductive paint, polymer or adhesive is electrically coupled to a ground plane. The sub-assembly may also be a ROSA or a TOSA, more about which is said below.

In another embodiment, there is provided a method of providing at least one of EMI shielding, EMP shielding and ESD shielding in an optical wavelength division or combination sub-assembly configured to receive or transmit optical signals conveyed thereto or therefrom, where the sub-assembly comprises an optically transparent or transmissive optical block comprising a substantially flat first upper external surface and an opposing substantially flat first lower external surface, two opposing first side external surfaces, and at least one first end external surface, a ferrule comprising an outer surface and a fiber optic cable receptacle for receiving the end of a fiber optic cable, a coupling module coupled to the ferrule and comprising a substantially flat second upper external surface and an opposing second lower external surface, two opposing second side external surfaces, at least one second end external surface, and a strain relief flange configured to transfer loads applied to the ferrule and receptacle, where at least portions of one of the external surfaces of the sub-assembly are covered with at an electrically conductive paint, polymer or adhesive. The electrically conductive paint, polymer or adhesive may be configured or formulated to have a desired degree or amount of electrical conductivity and thereby provide any one of EMI, EMP or ESD shielding according to the selected degree of electrical conductivity.

BRIEF DESCRIPTION OF THE DRAWINGS

Numerous aspects of the various embodiments of the present invention will become apparent from the following specification, drawings and claims in which.

FIGS. 4(a) through 4(c) show various perspective views of an LX4 ROSA that has been configured in accordance with one embodiment of the present invention.

The drawings are not necessarily to scale. Like numbers refer to like parts throughout the drawings. As noted above, reference numerals corresponding to elements shown in FIGS. 1 and 2 of U.S. Pat. No. 6,201,908 differ from those shown in FIGS. 4(a) through 4(c) hereof.

DETAILED DESCRIPTIONS OF SOME PREFERRED EMBODIMENTS

Figure 1:
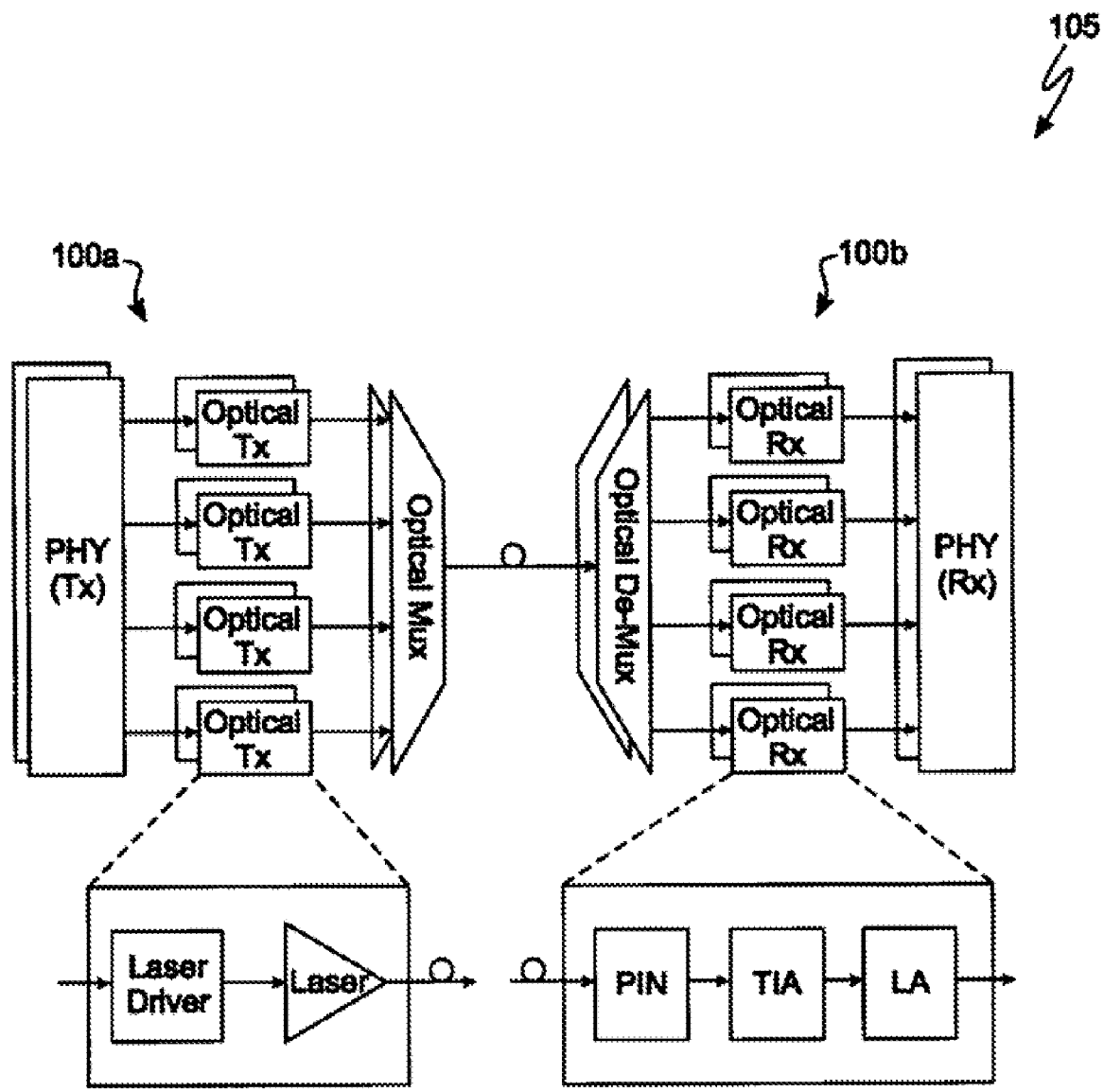
FIG. 1 shows a block diagram of a representative LX4 transmitter and receiver system.
Figure 2:
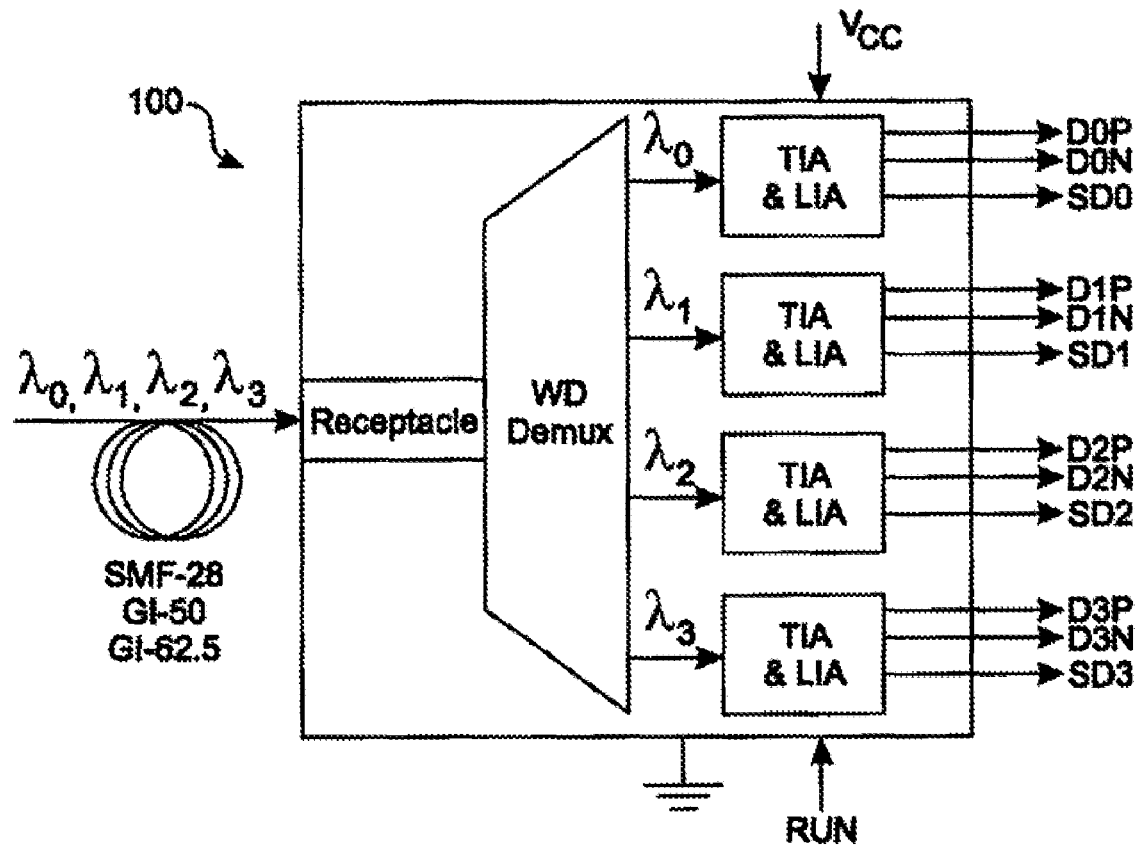
FIG. 2 shows a functional block diagram of one type of an LX4 ROSA demultiplexer.
Figure 3:
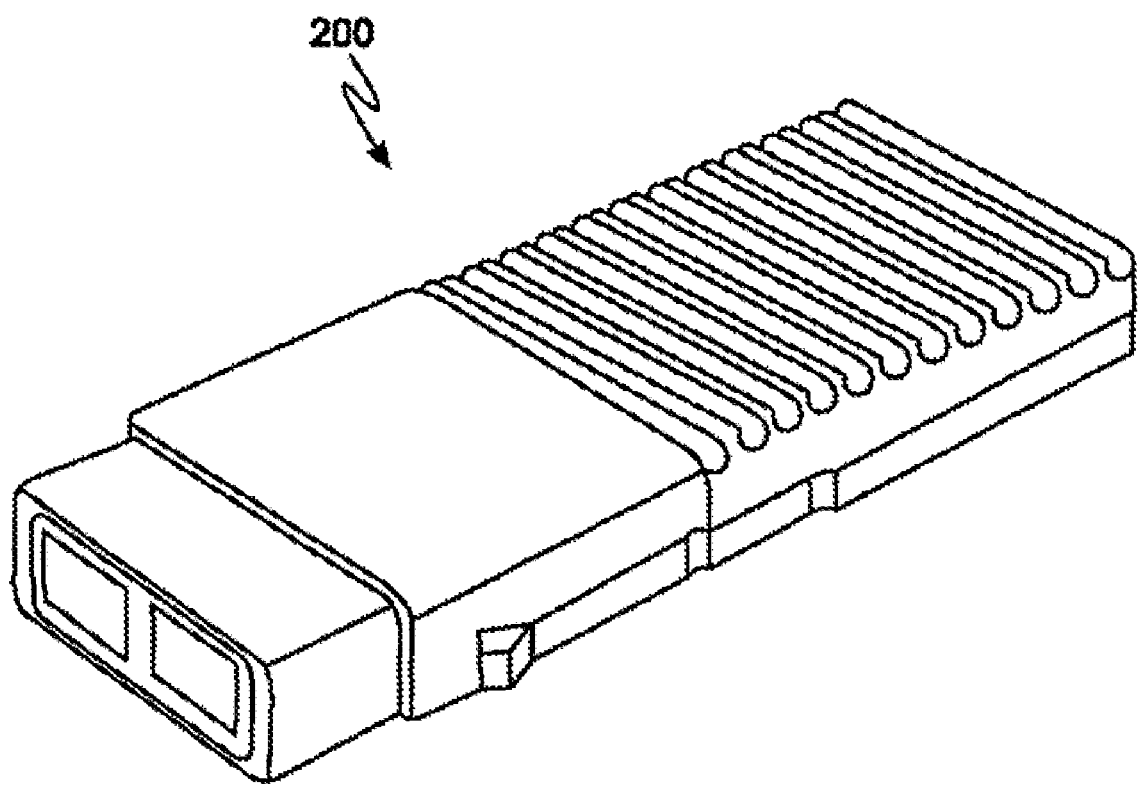
FIG. 3 shows an illustrative embodiment of an X2 form factor optical module.

Set forth hereinbelow are detailed descriptions of some preferred embodiments.

Referring now to FIGS. 4(a), 4(b) and 4(c) there are shown top front, top rear and bottom front perspective views, respectively, of an OMRON P1RX-LX4 ROSA that has been adapted in conformance with one embodiment of the present invention. As shown in FIGS. 4(a), 4(b) and 4(c) ROSA 100 is an optical wavelength division demultiplexer sub-assembly 100 configured to receive optical signals conveyed thereto by a fiber optic cable, and comprises optical block 110, ferrule 130 and coupling module 150, which in a preferred embodiment of the present invention are all formed of substantially optically transparent or transmissive plastic as described in the above-referenced Blaze patents.

Optical block 11 is a separate component of sub-assembly 100, and may be formed of optically transparent or transmissive glass or plastic. In a preferred embodiment, however, optical block 110 is formed of optical grade glass provided by Schott AG, and first upper external surface 112 thereof is precision polished or ground to provide an exceptionally flat and even surface In a preferred embodiment, coupling module 150 is formed of a single integrally molded piece of plastic and comprises ferrule 130, strain relief flange 162, fiber optic receptacle 134, and the portion thereof sandwiched between optical block 110 and photodetector array housing 170. One plastic suitable for use in forming an integrally molded embodiment of coupling module 150 is ULTEM 1000™ transparent plastic manufactured by GENERAL ELECTRIC™ Less preferably, coupling module 150 is formed from discrete glass or plastic components attached to one another by, for example, adhesive means.

In the embodiment illustrated in FIGS. 4(a) through 4(c), optical block 110 comprises substantially flat first upper external surface 112 and opposing substantially flat first lower external surface 114 (not shown), two opposing first side external surfaces 116 and 118, and at least one first end external surface 120. One or more first substantially optically transparent or transmissive optical pathways form a first optical portion of optical block 110.

In a preferred embodiment of the present invention, disposed atop substantially flat first upper external surface 112 is a suitable reflective coating configured to reflect light beams incident thereon for reflection in a downward direction towards corresponding filters and aspheric lenses disposed adjacent to substantially flat first lower external surface 114. The reflective coating may be, for example, an all-band infrared reflective coating. The filters are typically attached one-by-one to surface 114 or to second upper external surface 152 by adhesive means as discrete components. The aspheric lenses typically form a portion of integrally molded coupling module 150.

In the embodiment illustrated in FIGS. 4(a) through 4(c), ferrule 130 comprises external surface 132 and fiber optic cable receptacle 134 for receiving the end of a fiber optic cable therein. Ferrule 130 has one or more third substantially optically transparent or transmissive optical pathways forming a third optical portion thereof.

In the embodiment illustrated in FIGS. 4(a) through 4(c), coupling module 150 is coupled to, or more preferably integrally molded with, ferrule 130 and comprises second upper external surface 152, opposing second lower external surface 154 (not shown), two opposing second external side surfaces 156 and 158, at least one second end external surface 160, and strain relief flange 162 configured to transfer loads applied to ferrule 130 and receptacle 134. One or more second substantially optically transparent or transmissive optical pathways 164 form a second portion of coupling module 150.

In a preferred ROSA embodiment, multiplexed optical signals enter sub-assembly 100 via ferrule 130 and fiber optic cable receptacle 134, propagate along the third optical pathway, and are directed to optical block 110 via a collimating lens (not shown) and a reflective surface (also not shown), where they propagate along the second optical pathway. The various wavelength components of the incoming optical signal are separated from one another, or demultiplexed, by the filters and corresponding aspheric lenses located adjacent first lower surface 114 and second upper surface 152 to propagate along the first optical pathways. The filtered individual wavelength components of the incoming optical signal are then individually detected by corresponding photodetectors disposed in photodetector array assembly 170, which comprises third upper external surface 172, opposing third lower external surface 174, and two opposing third side external surfaces 176 and 178. Third end external surface 180 faces rearwardly in respect of ferrule 130. Like optical block 110, ferrule 130, and coupling module 150, in preferred embodiments portions of photodetector array assembly 170 are formed of substantially optically transparent or transmissive plastic and integrally molded as a single piece.

Connector flange 190 projects rearwardly from sub-assembly 100 and comprises a plurality of edge connectors similar to those commonly found on printed circuit boards. These edge connectors permit sub-assembly 100 to be electrically connected to module 200.

In a preferred TOSA embodiment of the present invention, multiplexed optical signals are transmitted from sub-assembly 100 through ferrule 130 and fiber optic cable receptacle 134 via the third optical pathway therethrough. The direction of travel of optical signals is reversed in a TOSA embodiment in respect of a ROSA embodiment, as those skilled in the art will understand.

Continuing to refer to FIGS. 4(a), 4(b) and 4(c), at least one of an electrically conductive paint, an electrically conductive polymer and an electrically conductive adhesive is applied to one or more of at least portions of first upper external surface 112, at least portions of two first side external surfaces 116 and 118, at least portions of the eternal surfaces of strain relief flange 162, at least some proximal portions of outer external surface 132, at least some exposed outer portions of second upper external surface 152, at least portions of second lower external surface 154, at least portions of two second side external surfaces 156 and 158, at least portions of third upper external surface 172, at least portions of third lower external surface 174, and at least portions of two third side external surfaces 176 and 178.

The electrically conductive paint, polymer or adhesive is applied to the foregoing surfaces employing techniques well known in the art, and permitted to dry, harden or cure. Depending on the type of coating applied, the coating may need to, or should be, heated to elevated temperatures, catalyzed or UV-cured to promote or effect drying, curing or hardening. Once dried, cured or hardened, the paint, polymer or adhesive provides an excellent EMI, EMP or ESD shield that, for example, permits little or no stray EMI to radiate from sub-assembly 100 and contaminate other optical or electrical signals present within, or outside and in proximity to, housing 200.

Note that in preferred embodiments of the present invention, and as illustrated in FIGS. 4(a), 4(b) and 4(c), not all external surfaces of sub-assembly 100 should or need be coated with an electrically conductive paint, polymer or adhesive. It has been discovered that certain external surfaces either do not need to be coated (e.g., the distal end of ferrule 130), or should not be coated to avoid impairing optical performance of sub-assembly 100 (e.g., exposed second end surface 160, third end surface 180, and at least some surfaces associated with connector flange 190).

Note further that the electrically conductive paint, polymer or adhesive may be configured to have an electrical conductivity suitable to provide EMI shielding, electromagnetic pulse ("EMP") shielding or electrostatic discharge ("ESD") shielding in respect of sub-assembly 100. Coatings suitable for EMI shielding have the highest conductivities, white coatings suitable for ESD shielding have the lowest conductivities. Coatings suitable for EMD shielding have conductivities falling somewhere between those of EMI coatings and ESD coatings. Appropriate respective ranges of electrical conductivity or resistivity for EMI, EMP and ESD coatings will be understood by those skilled in the art, and require no further elaboration here.

Electrically conductive paints suitable for use in the various embodiments of the present invention include, but are not limited to, electrically conductive paints that have been loaded with appropriate amounts of electrically conductive particles, electrically conductive carbon fibers, flakes and particles, carbon black, graphite, nano-particles, metal beads, flakes or particles, metal, glass or ceramic beads, flakes or particles that have been coated with a suitable metal such as silver, copper, nickel, tin, zinc or aluminum.

Electrically conductive polymers and related compositions suitable for use in the various embodiments of the present invention include, but are not limited to, electrically conductive polymers, polymeric compositions such as elastomers, elastomeric compounds and silicone, urethanes, polyurethanes, polysulfides, latex compositions, where such compositions that have been loaded with appropriate amounts of electrically conductive particles, electrically conductive carbon fibers, flakes and particles, carbon black, graphite, nano-particles, metal flakes, beads or particles, metal, glass or ceramic beads, flakes or particles that have been coated with a suitable metal such as silver, copper, nickel, tin, zinc or aluminum. Still further compounds and compositions may be employed to form the electrically conductive polymeric coating of one embodiment of the present invention as described in U.S. Pat. No. 5,685,632 to Schaller et al. entitled "Electrically conductive plastic light source," which patent is hereby incorporated by reference herein in its entirety.

Electrically conductive adhesives and related compositions suitable for use in the various embodiments of the present invention include, but are not limited to, electrically conductive adhesives, epoxies, one-part epoxies, two-part epoxies, glues, hot melts, cements, elastomeric cements and similar or related compounds and compositions that have been loaded with appropriate amounts of electrically conductive particles, electrically conductive carbon fibers, flakes and particles, carbon black, graphite, nano-particles, metal flakes, beads or particles, metal, glass or ceramic beads, flakes or particles that have been coated with a suitable metal such as silver, copper, nickel, tin, zinc or aluminum.

In a preferred embodiment of the present invention, the electrically conductive paint, polymer or adhesive applied to an external surface of sub-assembly 100 is electrically coupled or attached to a ground plane to further reduce EMI, EMP or ESD, as the case may be.

Under some circumstances, it may be desirable to prepare external surfaces of sub-assembly 100 for subsequent coating to promote bonding or adhesion of the coating to such surfaces. Techniques such as chemical etching or pre-coating of such surfaces may therefore be employed before the coating is applied so long as the selected technique does not adversely change or affect the mechanical, electrical or optical properties of the surfaces that are to be coated.

The electrically conductive coating of the present invention further includes within its scope an electrically conductive ink or gel that is stamped or otherwise applied to selected external surfaces of sub-assembly 100, and then permitted to dry, cure or harden.

It is important to note that the electrically conductive coatings of the present invention do not include within their scope plated or sputtered coatings, vapor deposited coatings, cathodic arc coatings, chemical vapor deposited coatings, ion plated coatings, or plasma-deposited coatings, as such types of coatings entail considerable expense and difficulty to implement successfully.

It will be understood by those skilled in the art that numerous variations, modifications, permutations and combinations of the foregoing electrically conductive paints, polymers and adhesives may be employed with the benefit of the hindsight provided by the present disclosure, and that many of such variations, modifications, permutations and combinations will fall within the scope of the present invention. The various embodiments of the present invention includes within their scope methods of making and using the modules, sub-assemblies, paints, polymers and adhesives described herein. The various embodiments of the present invention are not restricted to LX4 sub-assembly embodiments or sub-assemblies compatible with X2 housing, and extend to other types of fiber optic sub-assemblies where the electrically conductive paints, polymers and adhesives of the present invention may be usefully employed as EMI, EMP or ESD shields.

The preceding specific embodiments are illustrative of the practice of the invention. It is to be understood, therefore, that other expedients known to those skilled in the art or disclosed herein may be employed without departing from the invention or the scope of the appended claims. Having read and understood the present disclosure, those skilled in the art will now understand that many combinations, adaptations, variations and permutations of known fiber optic sub-assemblies may be employed successfully in conjunction with the various embodiments of the present invention.

We claim:

1. A sub-assembly, comprising:
an optically transparent or transmissive optical block comprising a substantially flat first upper external surface and an opposing substantially flat first lower external surface, two opposing first side external surfaces, and at least one first end external surface;
a ferrule comprising an outer surface and a fiber optic cable receptacle for receiving the end of a fiber optic cable;
a coupling module coupled to the ferrule and comprising a second upper external surface and an opposing second lower external surface, two opposing second side external surfaces, at least one second end external surface, and a strain relief flange configured to transfer loads applied to the ferrule and receptacle, and
at least one of an electrically conductive paint, an electrically conductive polymer and an electrically conductive adhesive covering at least portions of one of the external surfaces;
wherein the sub-assembly is an optical wavelength division or combination sub-assembly configured to receive or transmit optical signals conveyed thereto or therefrom.

2. The optical sub-assembly of claim 1, wherein the optical block is formed of glass or plastic.

3. The optical sub-assembly of claim 1, wherein the ferrule is formed of plastic.

4. The optical sub-assembly of claim 1, wherein the coupling module is formed of optically transparent or transmissive plastic.

5. The optical sub-assembly of claim 1, wherein the ferrule and the coupling module are integrally molded of optically transparent or transmissive plastic.

6. The optical sub-assembly of claim 1, wherein the electrically conductive paint, polymer or adhesive forms an at least partial electromagnetic interference ("EMI") shield in respect of the sub-assembly.

7. The optical sub-assembly of claim 1, wherein the electrically conductive paint, polymer or adhesive forms an at least partial electromagnetic pulse ("EMP") shield in respect of the sub-assembly.

8. The optical sub-assembly of claim 1, wherein the electrically conductive paint, polymer or adhesive forms an at least partial electrostatic discharge ("ESD") shield in respect of the sub-assembly.

9. The optical sub-assembly of claim 1, further comprising a photodetector array assembly disposed beneath the coupling module and the optical module and operatively associated therewith, the photodetector array assembly comprising a third upper external surface, an opposing third lower external surface, two opposing third side external surfaces, and a third end external surface.

10. The optical sub-assembly of claim 9, wherein the at least portions of one of the external surfaces comprises a surface selected from the group consisting of the third upper external surface, the opposing third lower external surface, the two opposing third side external surfaces, and the third end external surface.

11. The optical sub-assembly of claim 9, wherein at least portions of the photodetector array assembly are integrally molded and formed of substantially optically transparent or transmissive plastic.

12. The optical sub-assembly of claim 1, wherein the at least portions of one of the external surfaces comprises a surface selected from the group consisting of the first upper external surface, the two opposing first side external surfaces, the external surface of the ferrule, and the two opposing second side external surfaces.

13. The optical sub-assembly of claim 1, wherein the electrically conductive paint, polymer or adhesive is an electrically conductive paint loaded with at least one of electrically conductive particles, electrically conductive carbon fibers, flakes and particles, carbon black, graphite, nano-particles, metal beads, flakes or particles, and metal, glass or ceramic beads, flakes or particles that have been coated with a suitable metal such as silver, copper, nickel, tin, zinc or aluminum.

14. The optical sub-assembly of claim 1, wherein the electrically conductive paint, polymer or adhesive is at least one of an electrically conductive polymer, an elastomer, an elastomeric compound, silicone, urethane, polyurethane, polysulfide or latex, and is loaded with at least one of electrically conductive particles, electrically conductive carbon fibers, flakes and particles, carbon black, graphite, nano-particles, metal flakes, beads or particles, and metal, glass or ceramic beads, flakes or particles that have been coated with a suitable metal such as silver, copper, nickel, tin, zinc or aluminum.

15. The optical sub-assembly of claim 1, wherein the electrically conductive paint, polymer or adhesive is an electrically conductive adhesive selected from the group consisting of an epoxy, a one-part epoxy, a two-part epoxy, a glue, a hot melt, a cement and an elastomeric cement, and the electrically conductive adhesive is further loaded with at least one of electrically conductive particles, electrically conductive carbon fibers, flakes and particles, carbon black, graphite, nano-particles, metal flakes, beads or particles, and metal, glass or ceramic beads, flakes or particles that have been coated with a suitable metal such as silver, copper, nickel, tin, zinc or aluminum.

16. The optical sub-assembly of claim 1, wherein the electrically conductive paint, polymer or adhesive is an electrically conductive ink or gel.

17. The optical sub-assembly of claim 1, wherein the electrically conductive paint, polymer or adhesive is electrically coupled to a ground plane.

18. The optical sub-assembly of claim 1, wherein the optical wavelength division or combination sub-assembly is a ROSA.

19. The optical sub-assembly of claim 1, wherein the optical wavelength division or combination sub-assembly is a TOSA.

20. The optical sub-assembly of claim 1, wherein the sub-assembly is an LX4 sub-assembly.

21. The optical sub-assembly of claim 19, wherein the sub-assembly is housed in an X2 form factor module.

* * * * *